US006091824A

United States Patent [19]

Lin et al.

[11] Patent Number: 6,091,824

[45] Date of Patent: Jul. 18, 2000

[54] REDUCED-MEMORY EARLY REFLECTION AND REVERBERATION SIMULATOR AND METHOD

[75] Inventors: Kun Lin; James Martin Nohrden, both of Austin, Tex.

[73] Assignee: Crystal Semiconductor Corporation, Austin, Tex.

[21] Appl. No.: 08/938,813

[22] Filed: Sep. 26, 1997

[51] Int. Cl.[7] .................... H03G 3/00

[52] U.S. Cl. .................... 381/63; 84/630

[58] Field of Search .................... 381/17, 18, 1, 381/61, 63, 630; 84/DIG. 26

[56] References Cited

U.S. PATENT DOCUMENTS

| | | |
|---|---|---|
| Re. 33,739 | 11/1991 | Takashima et al. . |
| 4,214,501 | 7/1980 | von Kemenczky . |
| 4,371,748 | 2/1983 | Dijkmans et al. . |
| 4,489,439 | 12/1984 | Scholz et al. . |
| 4,509,191 | 4/1985 | Miller . |
| 4,570,523 | 2/1986 | Futamase et al. . |
| 4,584,700 | 4/1986 | Scholz . |
| 4,584,921 | 4/1986 | Wachi . |
| 4,649,786 | 3/1987 | Niinomi et al. . |
| 4,731,835 | 3/1988 | Futamase et al. . |
| 4,748,669 | 5/1988 | Klayman . |
| 4,817,149 | 3/1989 | Myers .................... 381/17 |
| 4,841,572 | 6/1989 | Klayman . |
| 4,866,774 | 9/1989 | Klayman . |
| 4,909,119 | 3/1990 | Morokuma . |
| 4,942,799 | 7/1990 | Suzuki . |
| 4,955,057 | 9/1990 | Tominari . |
| 4,984,276 | 1/1991 | Smith . |
| 5,012,199 | 4/1991 | McKale . |

(List continued on next page.)

FOREIGN PATENT DOCUMENTS

| | | |
|---|---|---|
| 0178840 | 4/1986 | European Pat. Off. . |
| 0568789 | 11/1993 | European Pat. Off. . |
| WO9534883 | 12/1995 | WIPO . |

OTHER PUBLICATIONS

Heinrich Kuttruff “Room Acoustics” Third Edition, Chapter VI, pp. 133–137 and 170, Elsevier Applied Science.

Leo L. Beranek, “Concert Hall Acoustics—1992”, pp. 1–39, © 1992 Acoustical Society of America.

James A. Moorer, “About This Reverberation Business”, Computer Music Journal, vol. 3., pp. 13–28.

*Primary Examiner*—Ping Lee

*Attorney, Agent, or Firm*—Skjerven, Morrill, MacPherson, Franklin & Friel LLP; Peter Rutkowski; Ken J. Koestner

[57] ABSTRACT

Early reflection and reverberation processing using a decimating filter simulates the high frequency attenuation of an actual physical and acoustical environment and advantageously reduces the memory storage and computational burden of the early reflection and reverberation processing method. A method of generating a reverberation effect in a sound signal includes decimating the sound signal in the sound signal path and forming an early reflection sound signal from the decimated sound signal. The early reflection sound signal has a reduced sample rate an attenuated high frequency components in comparison to the sound signal. The method further includes decimating the early reflection sound signal, recirculating the decimated early reflection sound signal in a plurality of iterations with a delay and a gain imposed between the iterations to form a reverberated sound signal, interpolating the early reflection sound signal and the reverberated sound signal, and accumulating the reverberated sound signal, the early reflection sound signal, and the sound signal to form a reflection and reverberation-enhanced sound signal. An audio signal processor processes a sound signal supplied to a sound signal path. The audio signal processor includes an early reflection processor connected to the sound signal path to receive the sound signal and simulate an early reflection signal, a reverberator connected to the early reflection processor to receive the early reflection signal and simulate a reverberation signal, and a summer connected to the sound signal path, the early reflection processor, and the reverberator. The early reflection processor and reverberator include a decimator for decimating the incoming signal.

11 Claims, 11 Drawing Sheets

U.S. PATENT DOCUMENTS

| | | | |
|---|---|---|---|
| 5,123,050 | 6/1992 | Serikawa et al. . | |
| 5,140,886 | 8/1992 | Masaki et al. . | |
| 5,179,238 | 1/1993 | Hotta . | |
| 5,201,005 | 4/1993 | Matsushita et al. . | |
| 5,247,474 | 9/1993 | Kowaki . | |
| 5,300,723 | 4/1994 | Ito . | |
| 5,305,386 | 4/1994 | Yamato . | |
| 5,317,104 | 5/1994 | Frost . | |
| 5,333,203 | 7/1994 | Diaz . | |
| 5,342,990 | 8/1994 | Rossum . | |
| 5,369,710 | 11/1994 | Asai . | |
| 5,384,856 | 1/1995 | Kyouno et al. . | |
| 5,491,754 | 2/1996 | Jot et al. . | |
| 5,498,835 | 3/1996 | Ichiki . | |
| 5,502,768 | 3/1996 | Shioda . | |
| 5,555,306 | 9/1996 | Gerzon . | |
| 5,567,901 | 10/1996 | Gibson et al. . | |
| 5,621,801 | 4/1997 | Kunimoto et al. . | |
| 5,644,098 | 7/1997 | Jenkins et al. . | |
| 5,665,929 | 9/1997 | Dong et al. . | |
| 5,731,534 | 3/1998 | Tamura et al. | 84/662 |
| 5,744,739 | 4/1998 | Jenkins | 84/603 |
| 5,812,677 | 9/1998 | Tamaru | 381/61 |

REDUCED-MEMORY EARLY REFLECTION AND REVERBERATION SIMULATOR AND METHOD

BACKGROUND OF THE INVENTION

1. Field of the Invention

The present invention relates to an audio signal processor and generator. More specifically, the present invention relates to an audio signal processor and synthesizer including a digital early reflection and reverberation simulator and corresponding operating method utilizing a reduced memory size through decimation and interpolation filters.

2. Description of the Related Art

Acoustical characteristics of musical venues, including the finest concert halls and auditoriums, are highly dependent on reverberation characteristics. Sounds produced in a concert hall are formed from original sound signals combined with echoes reflected and reverberated from multiple walls and surfaces of the hall. The reflected and reverberated signals produce the impression of space to a listener. The multiple combined signals vary in evoked response from annoyance or incomprehensibility for speech signals in a highly reverberant auditorium to ecstasy in the case of emotional romantic music in a well-designed concert hall. Music is most often played in a venue having a poor acoustic environment such as a home, an automobile, a multiple purpose auditorium for sporting events as well as performance events, and the like. The poor acoustic environment of these venues primarily relate to short reverberation times. One technique for improving sound quality in a space having a poor acoustic quality is to add a reverberation simulation special effect. Music recordings commonly include the addition of reverberation prior to distribution. Reverberation is added by a natural process such as recording in a concert hall or by adding sound from an artificial process such as a plate reverberator or a spring reverberator.

The first electronic reverberation simulators were designed using conventional analog circuitry. Analog reverberators are so difficult to design that designers commonly resort to reverberation using mechanical devices such as springs and special metal plates.

Development of digital circuitry greatly eases the problems in producing reverberation simulators. Digital reverberators are highly flexible and produce nearly any imaginable form of reverberation. A simple digital reverberator includes a delay element and a mixer for mixing delayed and undelayed sound signals, thereby generating a single echo. Multiple echoes are simulated in a digital reverberator by feeding a portion of the delayed output signal back to the input of the delay element, creating a sequence of echoes. Reverberation parameters for an echo include the duration of the delay and the relative amplitudes of the delayed and undelayed sounds.

A concert hall quality reverberation may be reproduced exactly by recording an impulse response of a selected concert hall and applying a transversal filter technique to a sound to be reverberated. Typical reverberations times of 2 seconds require usage of a filter that is 50 K to 100 K samples long, a size that is clearly impractical for implementation in an integrated circuit. However, many circuits created from delay elements, summers and multipliers produce a reverberation echo so long as the circuit is stable and does not oscillate.

A practical integrated circuit implementation of a concert hall quality reverberation simulator commonly includes several delay elements having unequal delay lengths. The values of the plurality of delay lengths, for example the placement of taps in a single delay line, determines the quality of sound of the simulator. A highly pleasing sound is produced by placing the taps according to an approximately exponential distribution but also a distribution in which the taps are placed at prime number locations. This structure of a reverberation delay line creates a maximum rate of echo amplitude growth.

High-quality audio processing and generation is heretofore achieved only in a system which includes a large amount of memory and which commonly includes more than one integrated circuit chip. Such a high-quality audio processing and reverberation system is cost-prohibitive in the fields of automotive acoustics, consumer electronics, consumer multimedia computer systems, game boxes, low-cost musical instruments and MIDI sound modules.

Implementation of reverberation simulation to greatly improve the quality of sound produced by a music synthesizer substantially increases the size of volatile or buffer storage. For example, a synthesizer which generates a 16-bit digital audio stream at 44. 1kHz typically employs a delay buffer size of about 32 Kbytes, an amount far higher than is feasible for implementation in low-cost and single-chip environments.

What is needed is a reverberation simulator having a substantially reduced memory size and computational load, and a reduced cost while attaining an excellent audio fidelity.

SUMMARY OF THE INVENTION

In accordance with the present invention, a method of generating a reverberation effect in a sound signal includes decimating the sound signal in the sound signal path and forming an early reflection sound signal from the decimated sound signal. The early reflection sound signal has a reduced sample rate and attenuated high frequency components in comparison to the sound signal. The method further includes recirculating the decimated sound signal in a plurality of iterations with a delay and a gain imposed between the iterations to form a reverberated sound signal, interpolating the early reflection sound signal and the reverberated sound signal, and accumulating the reverberated sound signal, the early reflection sound signal, and the sound signal to form a reflection and reverberation-enhanced sound signal.

In accordance with a further embodiment of the present invention, an audio signal processor processes a sound signal supplied to a sound signal path. The audio signal processor includes an early reflection processor connected to the sound signal path to receive the sound signal, a reverberator processor connected to the early reflection processor to receive the early reflection signal, and a summer connected to the sound signal path, the early reflection processor, and the reverberator processor. The early reflection processor includes a decimation filter for decimating the sound signal and an early reflection filter for simulating an early reflection signal. The reflection filter is a digital filter, typically a finite impulse response (FIR) filter although an infinite impulse response (IIR) filter may be used in some embodiments. In various embodiments the FIR and IIR filters may be implemented in the frequency domain or the time domain. The reverberator processor includes a reverberator for simulating a reverberation signal. The summer sums the sound signal, the early reflection signal, and the reverberation signal to generate an enhanced signal. The decimation filters are typically infinite impulse response (IIR) filters.

BRIEF DESCRIPTION OF DRAWINGS

The features of the described embodiments believed to be novel are specifically set forth in the appended claims. However, embodiments of the invention relating to both structure and method of operation, may best be understood by referring to the following description and accompanying drawings. The use of the same reference symbols in different drawings indicates similar or identical items.

DESCRIPTION OF THE PREFERRED EMBODIMENTS

Figure 1:
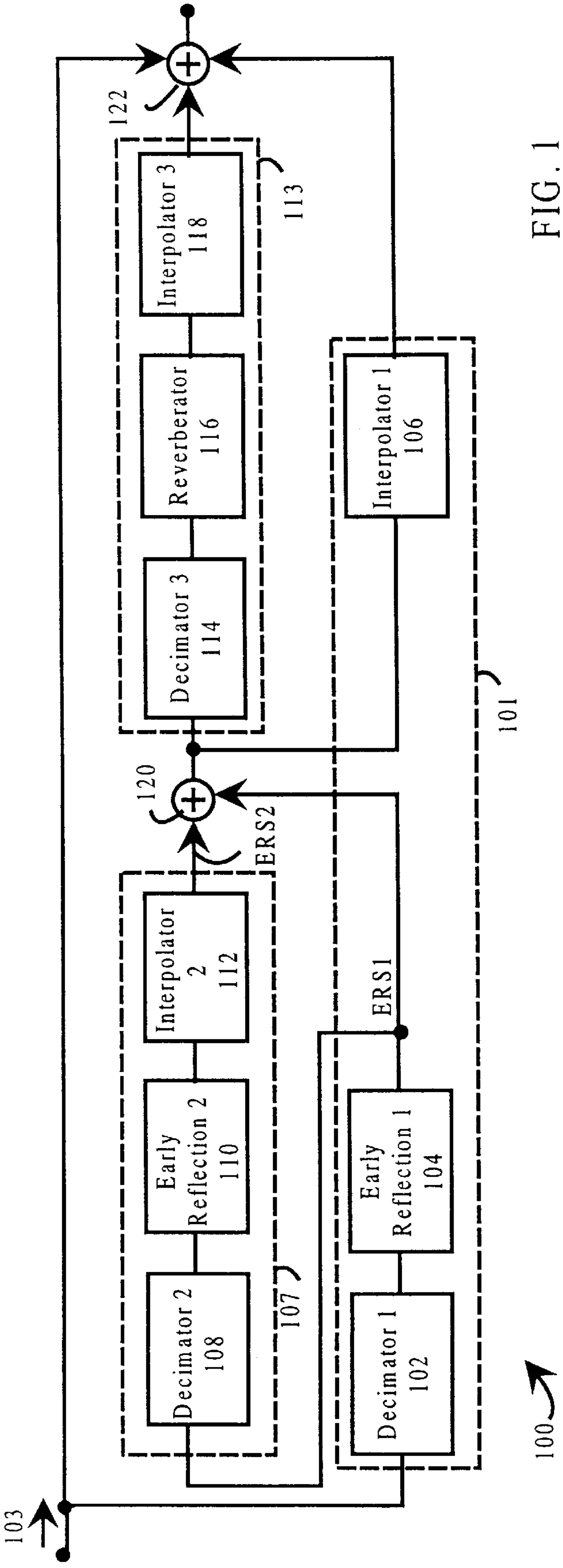
FIG. 1 is a schematic functional block diagram which illustrates operations of a first embodiment of a reflection and reverberation sound enhancement system for receiving a sound signal and generating initial reflected sounds and reverberated sounds from the sound signal.

Referring to FIG. 1, a schematic functional block diagram illustrates operations of a reflection and reverberation sound enhancement system 100 which receives a sound signal and generates initial reflected sounds and reverberated sounds from the sound signal. The reflection and reverberation sound enhancement system 100 sums the original, reflected and reverberated sounds to form an improved sound that simulates an acoustical environment of a concert hall. In various embodiments, the reflection and reverberation sound enhancement system 100 may be implemented using a variety of techniques including analog circuit components, digital circuit components, a digital signal processor, a computer system, microprocessors, general purpose computers, and the like. The reflection and reverberation sound enhancement system 100 includes a plurality of early reflection processors. The illustrative embodiment includes a first early reflection processing segment 101, a second early reflection processing segment 107, and a reverberator segment 113. The first early reflection processing segment 101 includes a first early reflection processor 104 preceded by a first decimator 102 and followed by a first interpolator 106. The decimator reduces the effective sampling rate while the interpolator increases the effective sampling rate. In the illustrative embodiment, the interpolator restores the sampling rate to the rate prior to decimation. The first early reflection processing segment 101 generates a first early reflection signal (ERS1) evoked by a direct sound signal 103. The second early reflection processing segment 107 includes a second early reflection processor 110 preceded by a second decimator 108 and followed by a second interpolator 112. The second early reflection processing segment 107 generates a second early reflection signal (ERS2), temporally following the first early reflection signal that is also evoked by the direct sound signal 103. The reverberator segment 113 includes a reverberator 116 preceded by a third decimator 114 and followed by a third interpolator 118. The reverberator segment 113 generates a reverberation signal formed as a combination of multiple reflections of the direct sound signal 103.

Other embodiments of a reflection and reverberation sound enhancement system 100 may include additional early reflection processing segments to generate additional simulated initial reflections in a sound signal. Additional early reflection processing segments generally result in a more pleasing sound at the cost of additional circuitry or computational resources.

Figure 2A:
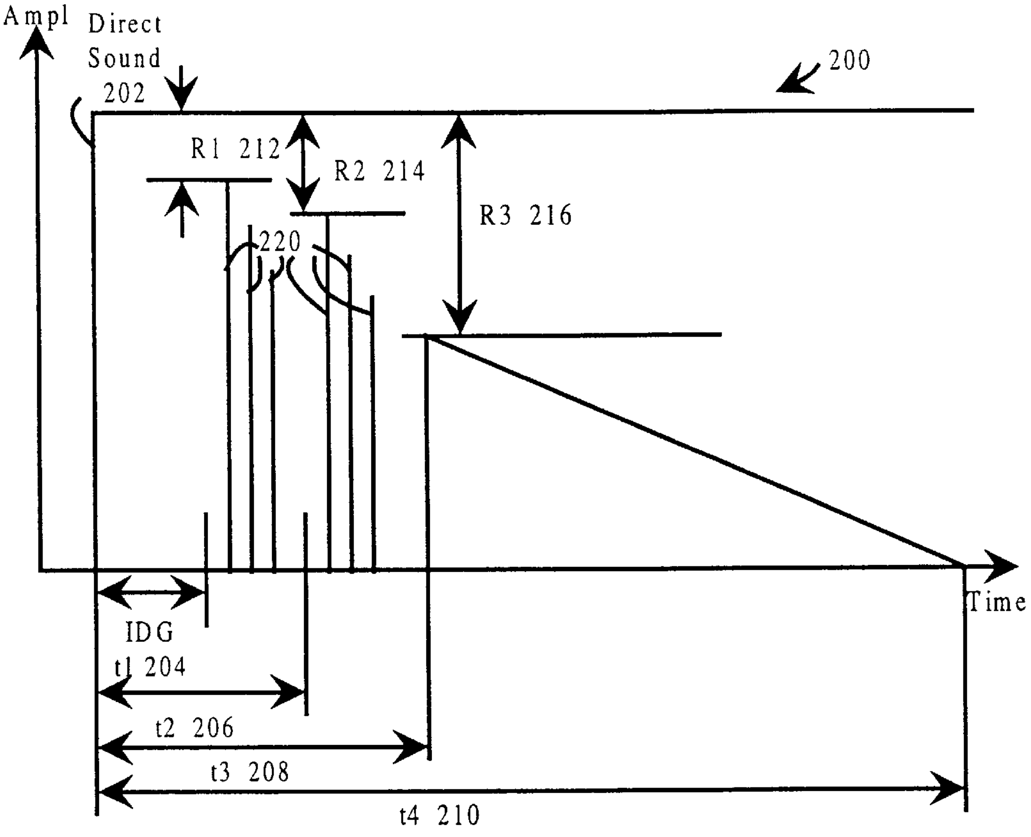
FIGS. 2A and 2B respectively and schematically illustrate a graphic sound signal view and a frequency response plot generated by a reflection and reverberation sound enhancement system shown in FIG. 1.

Referring to FIG. 2A, a graphic sound signal view in combination with the reflection and reverberation sound enhancement system 100 shown in FIG. 1 is illustrated. A direct sound signal 202 is applied to the reflection and reverberation sound enhancement system 100 and applied to the first decimator 102 after a programmed initial delay interval ($t_1$) 204. The decimated signal from the first decimator 102 is applied to the first early reflection processor 104 to simulate a first early reflection produced by the acoustics of a simulated concert hall. In an illustrative embodiment, the first early reflection processor 104 is a finite impulse response (FIR) filter having selected first early reflection filter coefficients and a programmed first early reflection gain RI 212. The early reflection filter coefficients and gain are typically determined using measurements from a concert hall or using ray tracing simulations, both techniques being well known in the art of concert hall acoustics.

The direct sound signal 202 is also applied to the second early reflection processing segment 107 following a second echo delay interval ($t_2$) 206. The decimated signal from the second decimator 108 is applied to the second early reflection processor 110 to simulate a second simulated early reflection signal that has sound characteristics emulating those produced by the acoustics of the simulated concert hall, delayed following the first simulated early reflection of the direct sound signal 202. Illustratively, the second early reflection processor 110 is a finite impulse response (FIR)

filter having selected second early reflection filter coefficients and a programmed second early reflection gain R2 214. The second early reflection is interpolated by a second interpolator 112 to restore the sample rate after reduction by the second decimator 108. The second simulated early reflection following interpolation and the first simulated early reflection without interpolation are added at a first summer 120.

The summed first and second early reflection signals are applied to the third decimator 114 after a programmed reverberation delay interval $t_3$ 208 following the application of the direct sound signal 202. In an alternative embodiment, other sound signals, such as the original sound signal, may be directly applied to the third decimator 114 rather than through the early reflection processors. The decimated signal from the third decimator 114 is applied to the reverberator processor 116 to simulate a reverberation produced by the acoustics of the simulated concert hall, delayed following the first and second early reflections. In an illustrative embodiment, the reverberator processor 116 is a cascaded multiple element comb filter followed by an all-pass filter which are described in more detail hereinafter. The reverberation is propagated for a programmed reverberation time ($t_4$ 410–$t_3$ 408). The reverberation signal is interpolated by the third interpolator 118 to restore the sample rate following decimation by the third decimator 114.

The summed first and second early reflection signals are also applied to the first interpolator 106 to restore the sample rate reduced through the application of the first decimator 102. The rate-restored first and second early reflection signals are added to the rate-restored reverberation signal at a second summer 122.

The first and second reflections simulate echoes that rebound from the walls of a concert hall following an initial impulse of sound.

The first decimator 102 and the second decimator 108 attenuate the high frequency components of the applied sound signal, thereby the physical characteristics of sound carried by the signal to simulate the attenuation of a sound signal wave traveling through air. As sound travels through the air, the sound is attenuated. The high frequency components of sound are attenuated most rapidly. The sound in early reflections has a higher frequency content than the sound in later reflections. The sound signal in the reverberation portion has little high frequency content.

The reflection and reverberation sound enhancement system 100 exploits the reduction of high frequency signal content with time following a sound signal impulse by reducing the amount of memory allocated for storing the signals decimated by the first decimator 102 of the first early reflection processing segment 101 and the second decimator 108 of the second early reflection processing segment 107. Each decimation reduces the high frequency content of the sample so that a first reflection sample following the first decimator 102 has a higher frequency content and a larger memory storage than the second reflection sample following the second decimator 108.

The second early reflection processor 110 operates at a lower sampling rate than the first early reflection processor 104. The reverberator 116 operates at a sample rate that is lower than the sampling rate of either the second early reflection processor 110 or the first early reflection processor 104. Multiple decimations are performed to reduce the effective sampling rate and memory size so that the reverberation enhancement is performed at a lower sampling rate and a smaller sample size than the reflection processing, advantageously reducing the memory size and computational burden in the reflection and reverberation sound enhancement system 100. Decimation advantageously reduces the amount of memory for performing the early reflection and reverberation processing. A large amount of memory is typically required for storing samples in a system which does not decimate the sound signal. However, the illustrative reflection and reverberation sound enhancement system 100 advantageously saves a large amount of memory by decimating the signal without a detectable penalty in sound quality since the decimated signal naturally has a reduced high frequency signal content due to the physical nature of the reflection and reverberation processes.

Figure 2B:
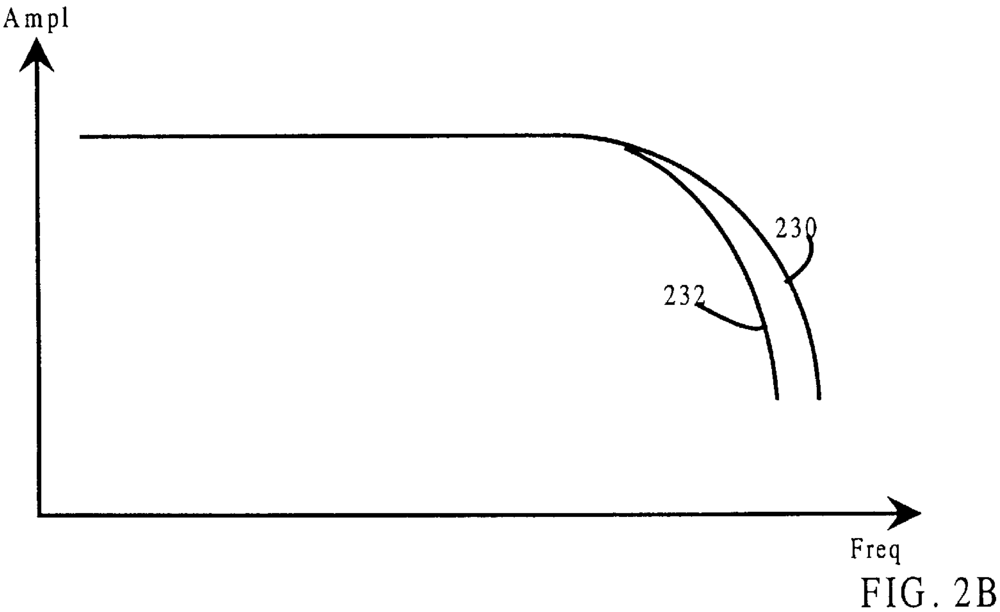

Referring to FIGS. 2A and 2B, which respectively illustrate a time domain graph of an impulse response and a frequency response plot generated by a reflection and reverberation sound enhancement system 100, an impulse response 200 has a form that varies depending on the simulated acoustic environment but generally includes an initial reflected sound portion occurring during the reverberation delay interval t3 208 and a subsequent reverberation sound portion occurring during the reverberation time ($t_4$ 410–$t_3$ 408). The initial reflected sound portion during the reverberation delay interval t3 208 includes high amplitude, high frequency distinct echoes 220 from walls, both soft walls and hard walls, of the simulated concert hall. The simulation also includes programming of a reverberation frequency response for selecting a hard wall response 230 or a soft wall response 242, for example.

The early reflection portion is illustrated by discrete lines during a time interval $t_2$ and depicts distinct echoes reflecting off walls of the simulated concert hall. The initial reflected portion expresses the spatial image of the acoustic environment. In the reverberation portion $t_4$ 410–$t_3$ 408 of the sound impulse, the density of echoes increases in proportion to the time squared and sounds are repetitively reflected by the wall surfaces of the simulated acoustic hall. The high frequency components of sound and the amplitude of the echoes decreases during the reverberation portion.

The impulse response 200 simulates the acoustic environment of a concert hall, describing a sound source as a omnidirectional pulsating circle directed in all directions of the simulated hall. The air and walls are presumed to be linear so that the impulse is a single ideal impulse and the impulse response reflects the acoustic characteristics of the hall. The impulse response is convolved with a musical sound to produce the sound of music in the simulated hall.

Reverberators are typically constructed using various delay elements such as delay lines. Characteristics of the delay elements determines the fidelity of a simulated reverberation response. Even with a perfect delay line, a sequence of echoes at equal intervals does not produce a concert hall-type reverberation. The reverberation heard in a concert hall results from an inverse exponential decay of echo amplitude over time that is common in physical processes. The rate of decrease in echo signal amplitude is commonly expressed as the time for a 60-dB reduction in echo amplitude where the 60-dB level approximates the level at which the reverberation signal becomes inaudible. Typical concert hall reverberation times range from approximately 1.5 to 3.0 seconds.

A reverberation process naturally has an uneven amplitude response which rises and falls with a periodicity equal to the reciprocal of the delay time. The uneven amplitude response of a concert hall-quality reverberation has peaks and valleys that are closely spaced, irregular, and moderate in height and depth. Commonly, concert hall reverberation has several peaks and valleys per hertz unit of bandwidth with a typical excursion between a peak and valley of approximately 12 dB. When a resonance chamber is small, sounds are produced with a high echo density and a low resonance density since resonant modes spanning a large number of wavelengths of moderate frequency sound are precluded by the limited distances between reflective surfaces. The converse condition of high resonance density and low echo density is produced by a lengthy delay time in a feedback delay reverberator, creating a sound alien to a typical reverberation sound.

The reflection and reverberation sound enhancement system 100 simulates distinct reflections of the high frequency distinct echoes 220 in a substantially accurate manner using the first early reflection processing segment 101 and second early reflection processing segment 107. The reflection and reverberation sound enhancement system 100 then simulates subsequent echoes using the reverberator 116. A reverberation process is characterized by an echo density parameter. A reverberator formed from a single delay line suffers from a low and constant echo density of about 0.03 echoes/msec. In contrast, a concert hall reverberation has an echo density which rapidly builds so that no echoes are distinguishable. One measure of the quality of simulated reverberation is the interval between an initial signal and the time the echo density reaches 1 echo per msec. A good quality reverberator reaches this echo density in about 100 msec. To avoid the perception of a distant sound, a delay of 10 msec to 20 msec should be interposed between the initial signal and the first echo. Initial delays and gains are chosen in accordance with the acoustic environment of a simulated concert hall or room. The reverberator 116 is selected to simulate the decay of the room reverberation after the density of the echoes has reached a level at which individual pulses are not separable.

Several programmable parameters are selected to select the response of the reflection and reverberation sound enhancement system 100. An initial delay interval $t_1$ 204 designates the delay between a direct sound signal and the initial early reflection signals. Early reflection signal coefficients designate the filter characteristics of the early reflection signal processor FIR filters. Reverberation time $t_4$ 410–$t_3$ 408 designates the duration of reverberation. A reverberation frequency response is set by selecting the filter coefficients in the reverberator 116 and is selected on the basis of the acoustic hardness of the walls in the simulate concert hall. Early reflection signal gain parameters g determine the amplitude of the early reflection signals. Reverberation gain determines the amplitude of the reverberation echo signals.

One parameter of the digital reverberator is a feedback factor which is indicative of the strength of the signal fed back to the delay element. The feedback factor has a value in the range from 0 to 1. The larger the feedback factor, the longer the sequence of audible echoes. An advantage of digital reverberators over analog reverberators is that no signal fidelity is lost during multiple passes through the delay element so that a feedback factor as close to one as possible is attained without forming a minor amplitude response peak which exceeds unity feedback and causes oscillation.

The reflection and reverberation sound enhancement system 100 is a digital system which is advantageously implemented as a low-cost, highly flexible system. The reflection and reverberation sound enhancement system 100 is highly flexible since the various parameters including coefficients, gains, delays and the like are easily controlled and adjustable. In the illustrative embodiment, the reflection and reverberation sound enhancement system 100 is flexibly controlled by software programming.

Referring again to FIG. 1, in an illustrative embodiment the first decimator 102 of the first early reflection processing segment 101, the second decimator 108 of the second early reflection processing segment 107, and the third decimator 114 of the reverberator segment 113 all decimate the received sound signal by a factor of two for the early reflection signal and for the reverberation. The decimators reduce the sample rate by two so that the number of computations and the delay memory size are reduced by approximately half.

In the illustrative embodiment, the first early reflection processor 104 and the second early reflection processor 110 are nonrecursive, finite impulse response FIR filters that are placed in the signal path of the reflection and reverberation sound enhancement system 100 to simulate the effect of the attenuation of higher frequencies by air. Attenuation is caused by physical effects of viscosity and heat conduction in air, and molecular absorption and dispersion in polyatomic gases exchanging translational and vibrational energy between colliding molecules. As a result of these effects, the intensity of sound at a particular frequency varies according to equation (1), as follows:

$$I = \frac{1}{x^2} I_0 e^{-mx},$$

where $I_0$ is the intensity at the source of the sound, x is the distance from the sound source, and m is an attenuation coefficient which varies as a function of frequency, and humidity, pressure, and temperature of the air. The larger the attenuation coefficient m the more attenuation of the sound signal at a particular frequency. As the frequency of the signal source is increased, the larger the attenuation coefficient m.

In the illustrative embodiment, the first early reflection processor 104 and the second early reflection processor 110 are nonrecursive finite impulse response (FIR) filters. FIR filters are advantageously used for early reflection signal processing due to the simple programmability of FIR filters. The discrete coefficients of the first and second early reflection signal processors 104 and 110 are programmed to selected magnitudes, for example, to select acoustical characteristics of different concert halls which are implemented as differing early reflection signal patterns. In contrast, the first decimation filter 102 and the second decimation filter 108 are implemented using recursive infinite impulse response (IIR) filters since IIR filters are implemented more efficiently than finite impulse response (FIR) filters and phase information, which is distorted by IIR filters, is immaterial. Infinite impulse response (IIR) filters are commonly implemented as a plurality of delays with delayed signals simply summed. The IIR filters are specified on the basis of a desired cutoff frequency and attenuation. The cutoff frequency is selected based on the amount of decimation of the sound signal that is desired.

In the illustrative embodiment, the first interpolator 106, the second interpolator 112, and the third interpolator 118 are interpolation filters that are implemented as inverse processes associated with the first decimator 102, second decimator 108, and the third decimator 114, respectively. In alternative embodiments, the interpolation filters may be implemented as filters that are not inverse to the decimation filters, although inverse filters advantageously restore the sampling frequency of the decimated signals with an efficient mathematical implementation.

Figure 3:
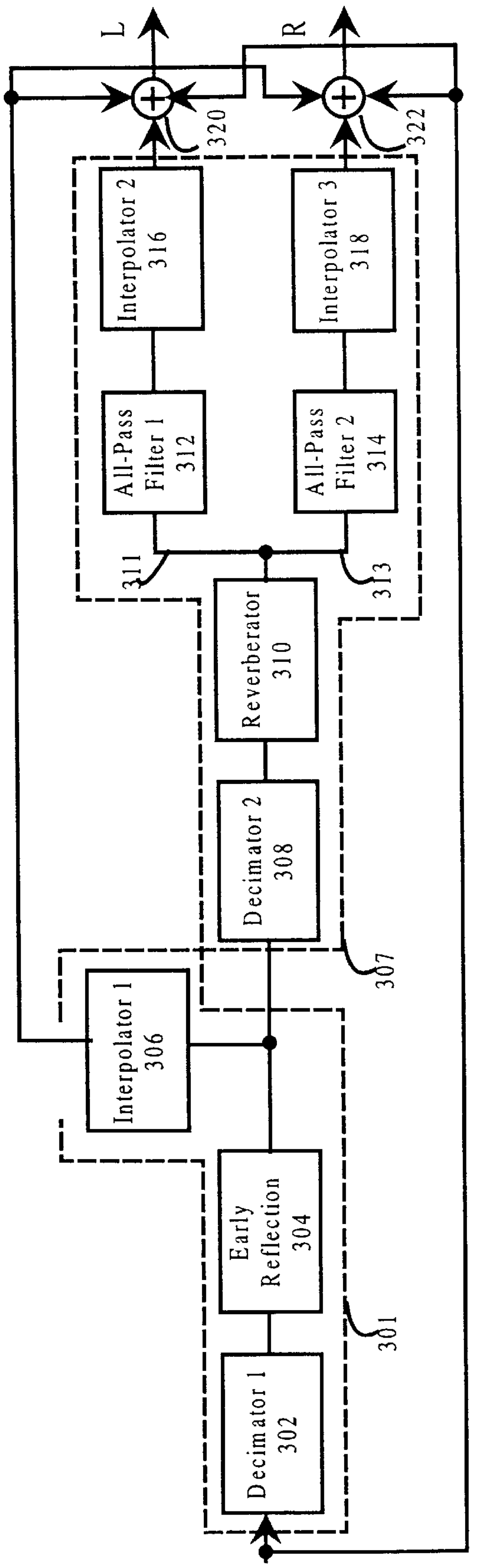
FIG. 3 is a schematic functional block diagram which illustrates operations of a second embodiment of a reflection and reverberation sound enhancement system for receiving a sound signal and generating initial reflected sounds and reverberated sounds from the sound signal.

Referring to FIG. 3, a schematic functional block diagram illustrates operations of a second embodiment of a reflection and reverberation sound enhancement system 300 for receiving a sound signal and generating initial reflected sounds and reverberated sounds from the sound signal. In various embodiments, the reflection and reverberation sound enhancement system 300 may be implemented using a variety of techniques including analog circuit components, digital circuit components, a digital signal processor, a computer system, microprocessors, general purpose computers, and the like. The reflection and reverberation sound enhancement system 100 includes a single early reflection processor 304 and a reverberation processor 310. The illustrative embodiment includes an early reflection processing segment 301 and a reverberator segment 307. The early reflection processing segment 301 includes the early reflection processor 304 preceded by a first decimator 302 and followed by a first interpolator 306. The first early reflection processing segment 301 generates a first early reflection signal (ERS1) evoked by a direct sound signal. The reverberator segment 307 includes a reverberator 310 preceded by a second decimator 308. The signal generated by the reverberator 310 is applied to two paths including a first path 311 and a second path 313. The first path 311 includes a first all-pass filter 312 and a second interpolator 316 and generates a signal that is added to the output signal from the first interpolator 306 at a first summer 320. The second path 313 includes a second all-pass filter 314 and a third interpolator 318 and generates a signal that is added to the output signal from the first summer 320 at a second summer 322 to supply an output signal of the reflection and reverberation sound enhancement system 300. Summed signals output from the first summer 320 and the second summer 322 are added to a direct sound input signal at an input summer 324 and the summed signal is applied to the early reflection processing segment 301.

Figure 4A:
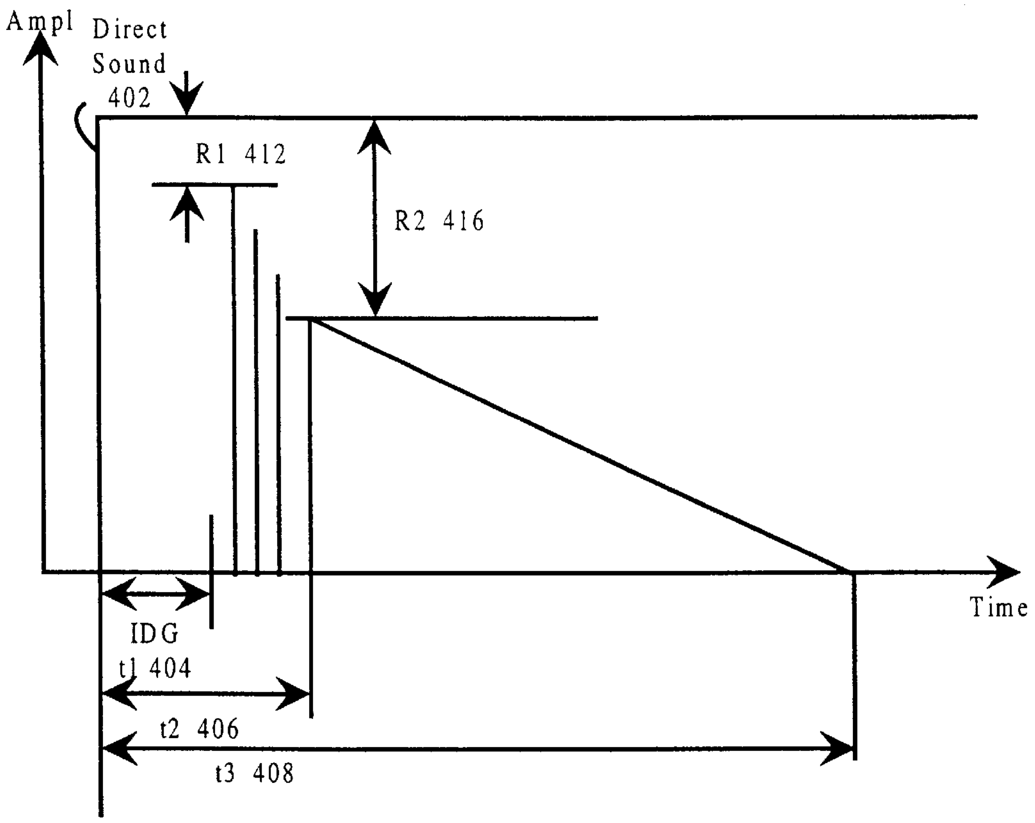
FIGS. 4A and 4B respectively and schematically illustrate a graphic sound signal view and a frequency response plot generated by a reflection and reverberation sound enhancement system shown in FIG. 3.
Figure 4B:
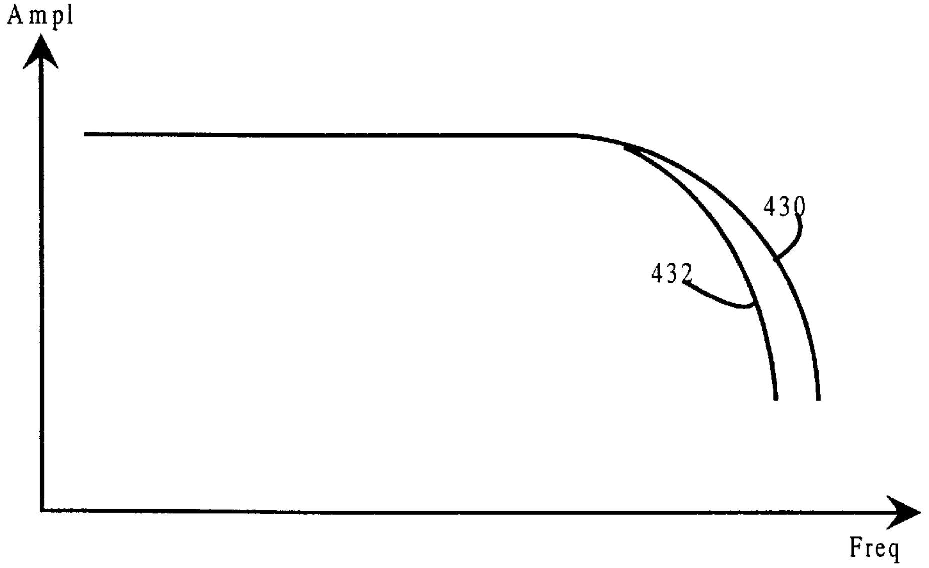

Referring to FIGS. 4A and 4B, a graphic sound signal view and a frequency response plot are respectively shown that are generated by a reflection and reverberation sound enhancement system 300. The simulated early reflection and reverberation response is similar to the response generated by the reflection and reverberation sound enhancement system 100 shown in FIG. 1 except that only a single group of early reflection signals is simulated by the reflection and reverberation sound enhancement system 300. Programmed parameters include an initial delay interval $t_1$ 404, a reverberation delay interval $t_2$ 406 and a subsequent reverberation sound portion occurring during the reverberation time ($t_3$ 408–$t_2$ 406). Programmed parameters also include selection of early reflection gain 412, reverberation gain 416 and a selection of reverberation frequency response including a selection between a hard wall response 430 and a soft wall response 432.

Figure 5:
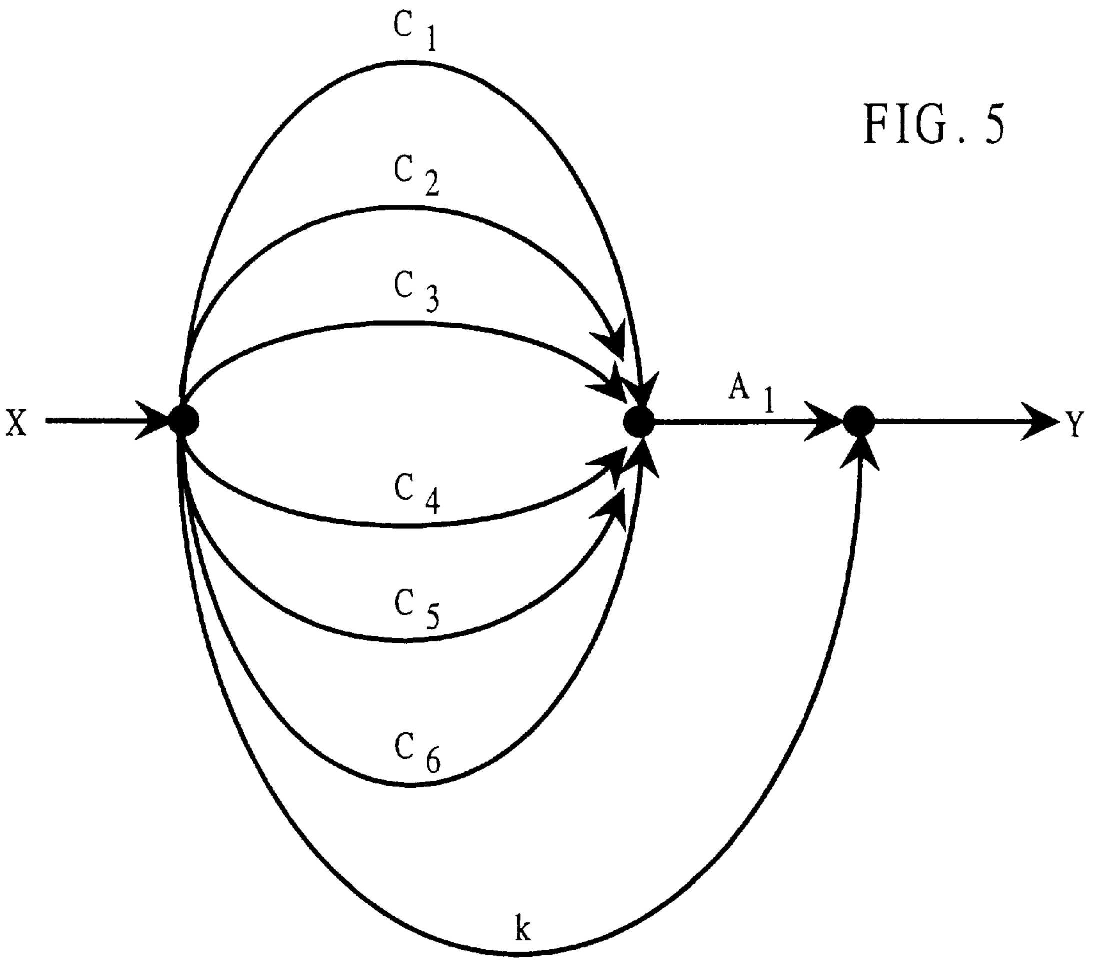
FIG. 5 is a schematic block diagram illustrating an embodiment of a reverberator in the reflection and reverberation sound enhancement system shown in FIGS. 1 and 2.

Referring to FIG. 5, a schematic block diagram illustrates an embodiment of a reverberator such as reverberator 116 shown in FIG. 1 and reverberator 310 shown in FIG. 3. The illustrative diagram employs signal flow graphs to represent filter structures so that a signal X represents the input to a filter and signal Y represents an output signal of the filter. Arcs that are joined at a node are added. When multiple arcs leave a node, the same signal is applied to all arcs. An arc represents a gain or multiply operation, a delay denoted by unit advance operator Z raised to a negative power, or another filter represented by a capital letter. The filter represented by the capital letter is a function of z.

The illustrative reverberator includes six comb filters $C_1$, $C_2$, $C_3$, $C_4$, $C_5$, and $C_6$ connected in parallel and connected in series with an all-pass filter $A_1$. The reverberator produces a reverberation having a decay of higher frequency sound components that is faster than the decay of lower frequency sound components. The greater attenuation of high frequency components advantageously results in a sound with improved realism, insensitivity to errors in delay duration, and robust treatment of short, impulsive sounds.

The six comb filters $C_1$, $C_2$, $C_3$, $C_4$, $C_5$, and $C_6$ are cascaded, connected in parallel, and followed by the all-pass filter $A_1$ with a feed-forward connection of a portion of the input musical signal with a scaling k added to the output signal. The reverberator uses the individual comb filters $C_1$, $C_2$, $C_3$, $C_4$, $C_5$, and $C_6$ and the all-pass filter $A_1$ to simulate the effect of wall reflection signals and the transit time of a wave front as the wave front passes between walls in a simulated acoustic environment. The feedforward signal simulates the proximity of the sound source to the listening destination. As the destination listener moves away from the sound source, the perceived reverberation remains at approximately the same amplitude but the direct sound signal intensity decreases by a reciprocal distance squared term. Accordingly, at a particular distance from the sound source the direct and reverberant sounds are equal in amplitude. At further distances from the sound source, the reverberant sound predominates over the direct sound signal. Wall reflection signals are simulated by varying feedback path lengths and transit times between reflections. Accordingly, the six comb filters $C_1$, $C_2$, $C_3$, $C_4$, $C_5$, and $C_6$ are specified by selection of parameters including gains and delay lengths. In some embodiments, all delay lengths are made mutually prime to reduce the effect of many peaks forming on a single sample, advantageously leading to a more dense and uniform delay.

Figure 6:
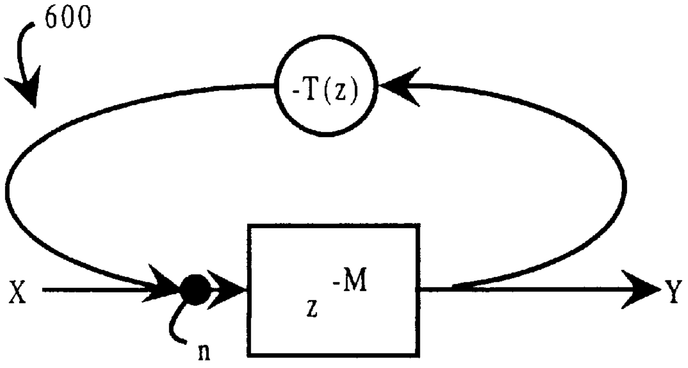
FIG. 6 is a schematic block circuit diagram which illustrates an embodiment of a comb filter.

Referring to FIG. 6, in an illustrative embodiment the comb filters $C_1$, $C_2$, $C_3$, $C_4$, $C_5$, and $C_6$ are simple first-order filters with a gain magnitude $g_1$ that is positive and less than one to ensure stability and a low-pass filter characteristic behavior. The transfer function of the low pass filters 304 is, as follows:

$$T(z) = \frac{z^{-m}}{1 - g_1 z^{-m}} \cdot g_2.$$

The maximum value of the transfer function at ω=0 is, as follows:

$$T(0) = \frac{g_2}{1 - g_1}.$$

Gain of $g_2$ is set to $g(1-g_1)$, where g is between zero and one. The resulting filter characteristic is unconditionally stable and has a gain $g_1$ with a value in the suitable range between zero and one. The purpose of the comb filters $C_1$, $C_2$, $C_3$, $C_4$, $C_5$, and $C_6$ is to simulate the absorption of high frequency sound signals by the air. The illustrative comb filters are simple and efficient, typically adding only a single multiplication operation, and suitably, though inexactly, simulating the actual absorption process.

The six comb filters $C_1$, $C_2$, $C_3$, $C_4$, $C_5$, and $C_6$ create a reverberation effect by recirculating the sound signal with a delay and attenuation between each iteration of the recirculated sound. Each iteration, the high frequency components of the sound signal are attenuated preferentially over low frequency components.

In other embodiments of the reflection and reverberation sound enhancement systems 100 and 300, various other filter configurations may be employed. For example, other filter are discussed by J. A. Moorer in "About This Reverberation Business", *COMPUTER MUSIC JOURNAL*, V3, No. 2, pages 13–28, 1979, which is hereby incorporated by reference in its entirety. In particular, other embodiments may have more or fewer comb filters. The illustrative embodiment having six cascaded comb filters has been found advantageous on the basis that a resulting reverberation signal is found to be improved when additional comb filters are added for up to six comb filters. Adding further comb filters has been found to improve the resulting reverberation signal only slightly, if at all. Some embodiments may use more than one all-pass filter. Other forms of comb filters may be used such as an oscillatory comb filter having multiple feedback paths, each path with a selectable gain and delay. Other comb filters may include one or more additional filters inside the comb filter loop, the additional filters may have various selectable transfer functions. Other all-pass filter configurations may be used such as an oscillatory all-pass filter. In another embodiment, an all-pass filter has a feedforward filter in a feedforward path and a feedback filter in a feedback path with the feedforward and feedback filters related as complex conjugates to achieve an all-pass filter characteristic.

Referring to FIG. 6, a schematic block circuit diagram illustrates an embodiment of a comb filter of the six comb filters $C_1$, $C_2$, $C_3$, $C_4$, $C_5$, and $C_6$. The comb filter 600 has a variable gain. The comb filter 600 includes a delay line $z^{-M}$, a feedback gain amplifier $g_1$, and an adder node n. An input signal is applied to an input terminal of the comb filter 600. A feedback signal from the delay line $z^{-M}$ is applied to an input terminal of the feedback amplifier $g_1$. An amplified input signal and an amplified feedback signal are applied to the adder node n from the input terminal and the feedback amplifier $g_1$, respectively. The delay line $z^{-M}$ receives the sum of the amplified feedback signal and the amplified input signal from the adder node n. The output signal from the comb filter 600 is the output signal from the adder node n.

Figure 7:
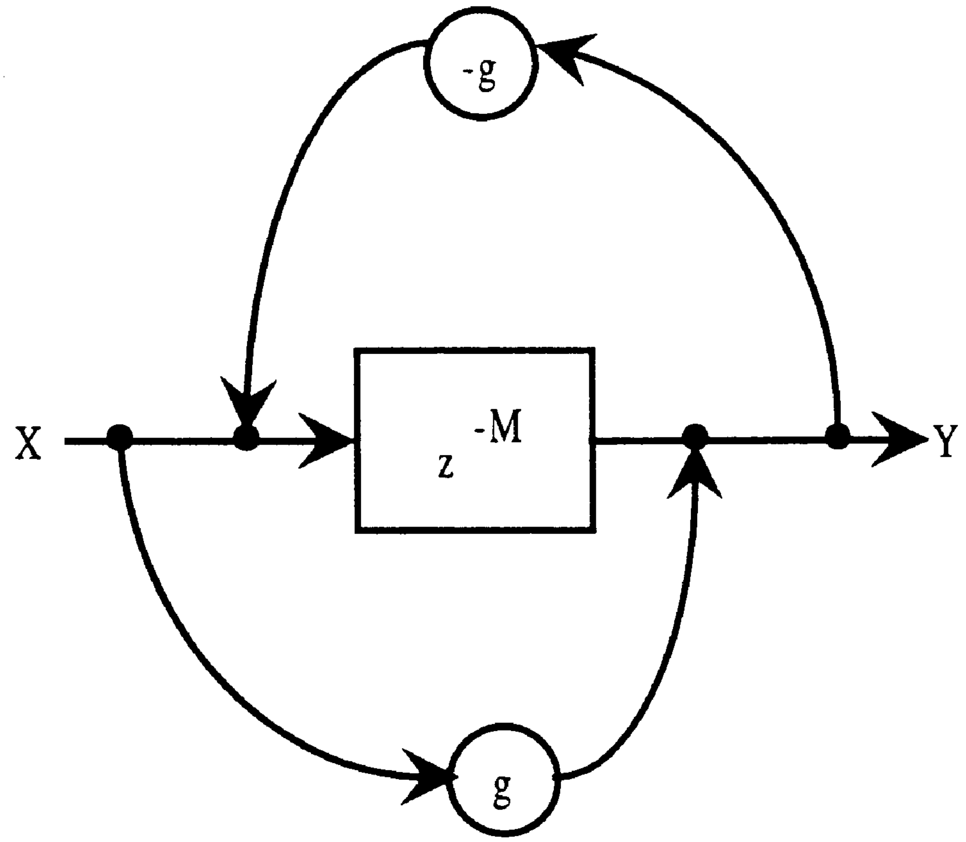
FIG. 7 is a schematic block circuit diagram which illustrates an embodiment of an all-pass filter.

Referring again to FIG. 7, the illustrative all-pass filter 700 has a transfer function, as follows:

$$T(z) = \frac{g + z^{-m}}{1 + gz^{-m}},$$

where g specifies a gain and z raised to the negative power m relates to a delay. In the transfer function of the all-pass filter 700, the coefficients in the numerator are in the reverse order of the coefficients in the denominator, forcing the zeroes to be the reciprocals of the poles. The result is an all-pass filter 700 with a uniform frequency response and a substantially unchanging spectral balance over time.

Figure 8:
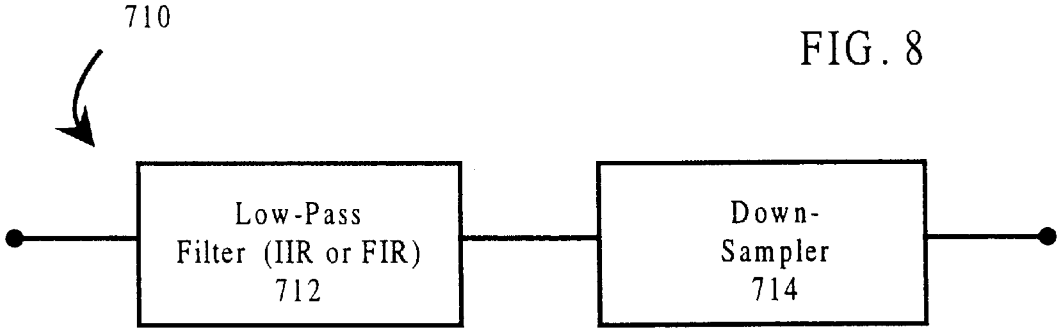
FIG. 8 is a schematic block diagram showing an embodiment of a decimator for reducing the effective sampling rate of an audio signal in the integrated audio processor circuit.

Referring to FIG. 8, a schematic block diagram shows a decimation filter 710 which is suitable for a sound processing system. The decimation filter 710 includes a low pass filter 712 and a down sampler 714 for reducing the sampling rate of a signal. The low pass filter 712 may be implemented as an infinite impulse response (IIR) filter or a finite impulse response (FIR) filter and supplies an anti-aliasing function. The down sampler 714 reduces the signal sampling rate, typically by deleting samples at regular intervals.

Figure 9:
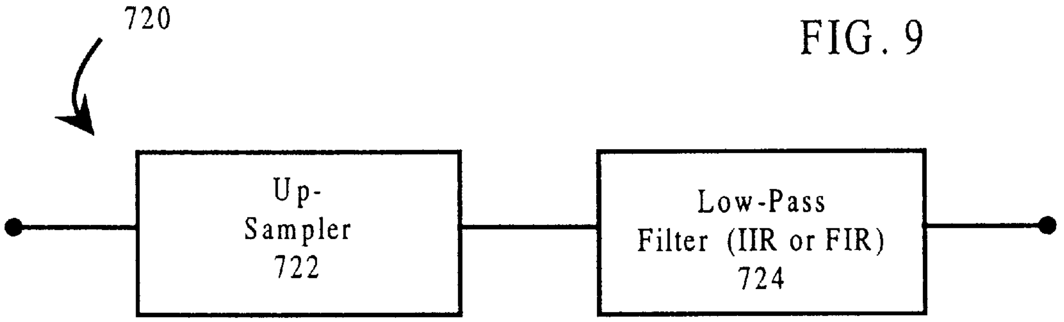
FIG. 9 is a schematic block diagram illustrating an embodiment of an interpolator for increasing the effective sampling rate of an audio signal in the integrated audio processor circuit.

Referring to FIG. 9, a schematic block diagram shows an interpolation filter 720 which is suitable for a sound processing system. The interpolation filter 720 includes an up-sampler 722 and a low pass filter 724. The up-sampler 722 increases the sample rate of a digital signal by padding the signal with data zeroes. The low pass filter 724 may be implemented as an infinite impulse response (IIR) filter or a finite impulse response (FIR) filter and supplies an anti-aliasing function and provides fills the padded zeroes.

Figure 10:
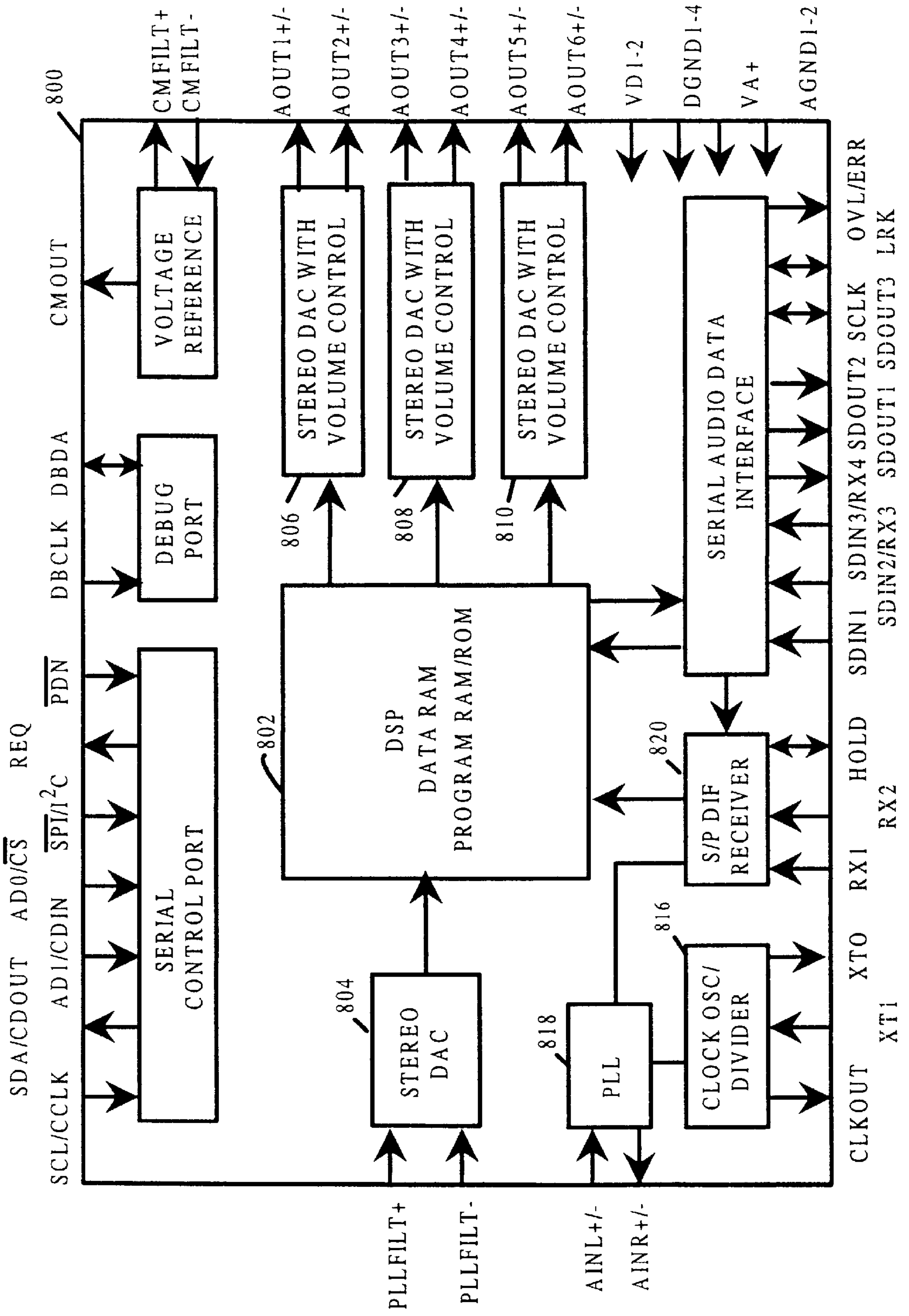
FIG. 10 is a schematic block diagram illustrating an integrated audio processor circuit for implementing an embodiment of the reflection and reverberation sound enhancement system.

Referring to FIG. 10, a schematic block diagram illustrates an integrated audio processor circuit 800 for implementing embodiments of the reflection and reverberation sound enhancement system 100 and 300. The audio processor circuit 800 includes a core digital signal processor 802 which receives digital audio signals from a stereo analog-to-digital converter (ADC) 804 and a S/PDIF receiver 820 that is known in the art. The core digital signal processor 802 supplies processed digital audio signals to a first stereo digital-to-analog converter (DAC) 806, a second stereo DAC 808, and a third stereo DAC 810. The stereo ADC 804 accepts audio signals from input lines AINL and AINR. The core digital signal processor 802 receives control signals from an external source via a serial control port 812. The core digital signal processor 802 receives test control signals from a debug port 814. Timing signals are generated by an oscillator/divider circuit 816 and controlled by a phase-locked loop 818. The core digital signal processor 802 includes 6 Kbytes of dynamic random access memory (DRAM) for data storage including temporary storage of sound signal data. The core digital signal processor 802 also includes 2 Kbytes of program memory for implementing processes and methods including programs implementing the functions of the reflection and reverberation sound enhancement system 100. In the illustrative embodiment, the stereo ADC 804 has 24-bit resolution, 100 dB dynamic range, 90 dB interchannel isolation, 0.01 dB ripple, and 80 dB stopband attenuation. The first stereo DAC 806, second stereo DAC 808, and third stereo DAC 810 are 24-bit resolution digital-to-analog converters having 108 dB signal-to-noise ratio, 100 dB dynamic range, 90 dB interchannel isolation, 0.01 dB ripple, 70 dB stopband attenuation, and 238 step attenuation at 0.5 dB per step.

In the illustrative embodiment, the reflection and reverberation sound enhancement system 100 is employed in the audio processor circuit 800 for usage in a automotive audio system. The audio processor circuit 800 has four channels corresponding to a left front speaker, a right front speaker, a left rear speaker, and a right rear speaker. The reflection and reverberation sound enhancement system 100 is highly advantageous in an automotive audio system because an automobile interior forms a very small acoustical environment. In the small acoustic environment, early reflection signals and reverberation are not developed so that a pleasing sound of a concert hall is not naturally achieved. The reflection and reverberation sound enhancement system 100 artificially adds early reflection signals and reverberation to produce a pleasing, spacious sound.

In the illustrative embodiment, the reflection and reverberation sound enhancement system 100 is implemented as software operating the audio processor circuit 800 by executing instructions in the core digital signal processor 802. The audio processor circuit 800 receives audio signals via the stereo ADC 804 and processes the signals in the core digital signal processor 802. The core digital signal processor 802 includes computational code for executing decimation operations of the first decimator 102 and second decimator 108 and storing the decimated data in the 6 Kbyte memory within the core digital signal processor 802. The core digital signal processor 802 accesses and processes the decimated data to perform operations of the first early reflection processor 104 and the second early reflection processor 110. The core digital signal processor 802 further includes computational code for executing the operations of the reverberator 116 and the interpolators including the first interpolator 106, the second interpolator 112, and the third interpolator 118. The amount of memory for storing the audio signals during initial reflection and reverberation processing is reduced through the decimating steps.

Figure 11:
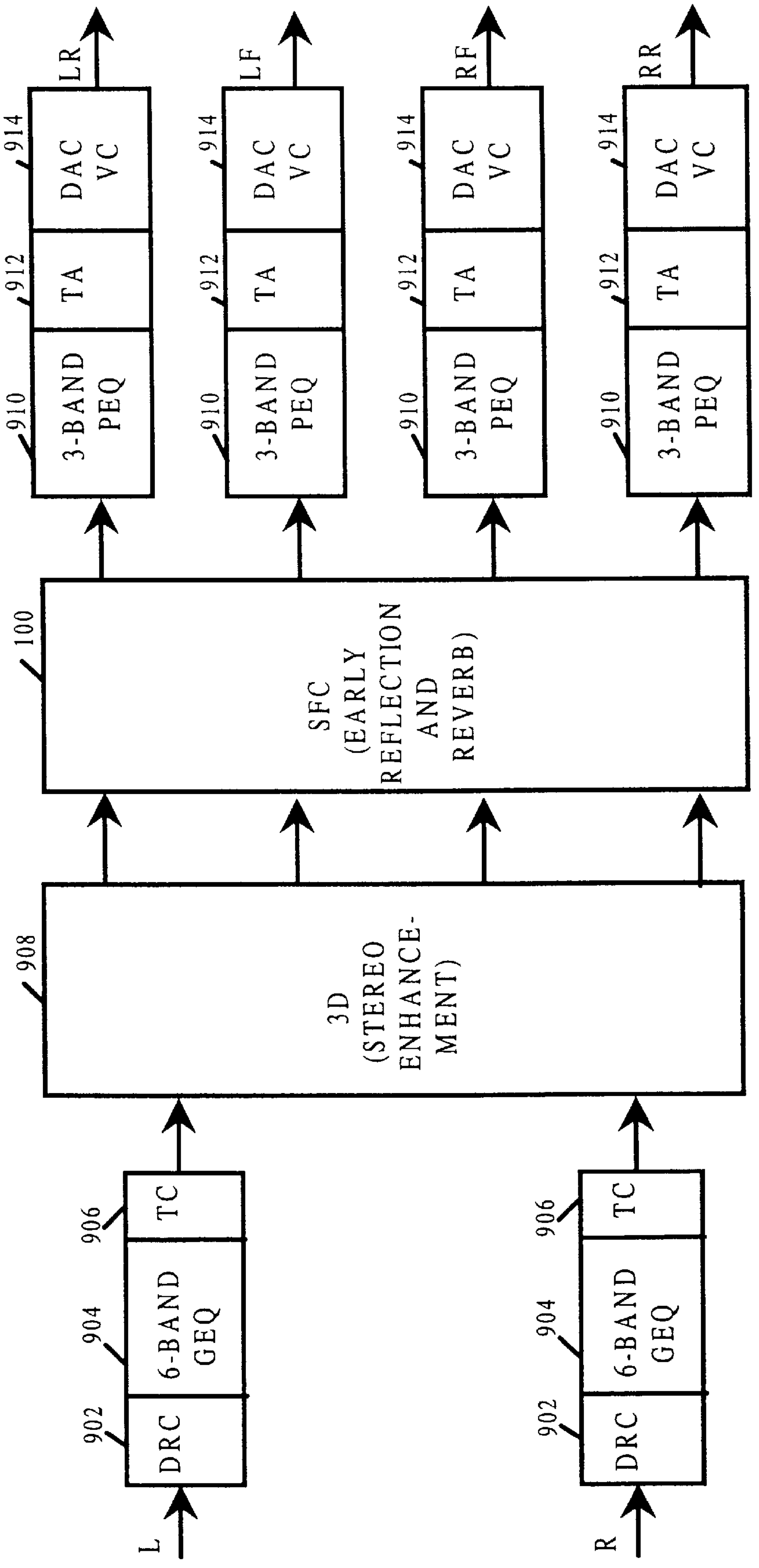
FIG. 11 is a schematic functional block diagram illustrating operations of an audio digital signal processing method including operations of the reflection and reverberation sound enhancement system.

Referring to FIG. 11, a schematic functional block diagram illustrates operations of an audio digital signal processing method 900 including operations of the reflection and reverberation sound enhancement system 100. The audio digital signal processing method 900 includes processing of a left channel and a right channel. Dynamic range compression (DRC) 902 is performed independently in the left and right channels to dynamically raise the volume control of sound signals in the presence of noise. The compressed signals in the left channel and the right channel are respectively equalized using left and right channel 6-band graphic equalizers (GEQ) 904. Tone control 906 is used in the left and right channels to dynamically boost the treble and base signals. A three-dimensional stereo enhancement process 908 improves sound quality by adjusting volume in three dimensions. Signals from the three-dimensional stereo enhancement process 908 are applied to the reflection and reverberation sound enhancement system 100 to improve the generated sound by adding early reflection and reverberation signals to the original sound signal. Signals from the reflection and reverberation sound enhancement system 100 are divided into four output channels including right front, left front, right rear, and left rear channels. The four output channels are individually processed using a 3-band parametric equalization process 910, a time alignment process 912, and a volume control (VC) process 914. The time alignment process 912 adjusts delay intervals for the four output channels to achieve in-phase sound signals throughout a three-dimensional space.

Figure 12:
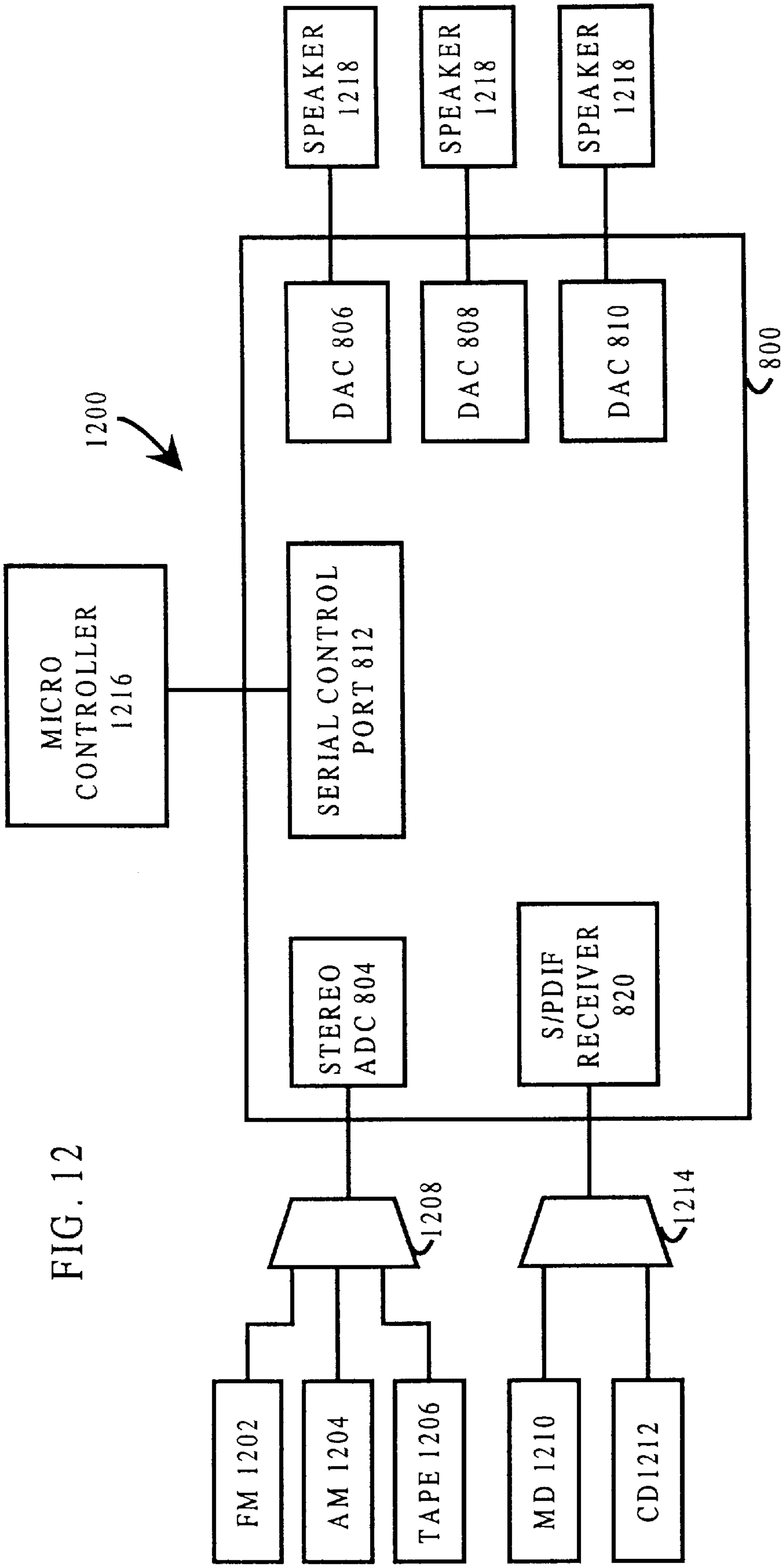
FIG. 12 is a schematic block diagram illustrating an embodiment of an audio/home theatre system utilizing the audio processor circuit.

Referring to FIG. 12 in conjunction with FIG. 10, a schematic block diagram illustrates an embodiment of an audio/home theatre system 1200 utilizing the audio processor circuit 800. The audio processor circuit 800 receives input signals originating from multiple various media types including FM radio 1202, AM radio 1204, cassette tape 1206 via a multiplexer 1208. The multiplexer 1208 is connected to the stereo ADC 804 to supply signals for performance by the audio processor circuit 800. The audio processor circuit 800 also receives input signals originating from further media types such as minidisk 1210 and compact disk 1212 via a multiplexer 1214. The multiplexer 1214 is connected to the S/PDIF receiver 820 to supply signals for performance by the audio processor circuit 800. The audio processor circuit 800 is controlled by signals from a control device such as a microcontroller 1216 that is connected to the audio processor circuit 800 via the serial control port 812. Audio signals generated by the audio processor circuit 800 are transmitted via first stereo DAC 806, second stereo DAC 808, and third stereo DAC 810 to speakers 1218 to produce sound signals.

Figure 13:
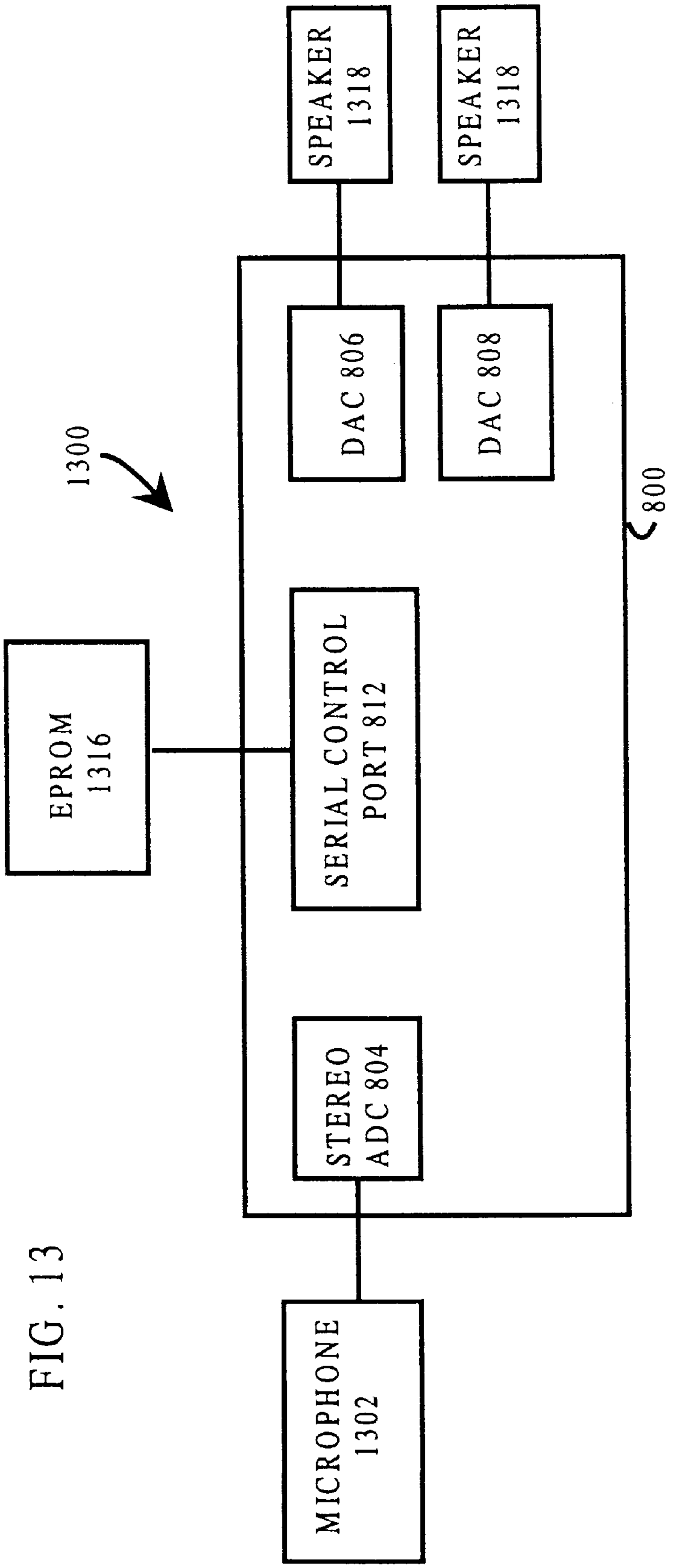
FIG. 13 is a schematic block diagram illustrating an embodiment of an electronic musical instrument system utilizing the audio processor circuit.

Referring to FIG. 13 in conjunction with FIG. 10, a schematic block diagram illustrates an embodiment of an electronic musical instrument system 1300 utilizing the audio processor circuit 800. The audio processor circuit 800 receives input signals originating from multiple a microphone 1302 connected to the stereo ADC 804 to supply signals for performance. The audio processor circuit 800 is controlled by signals, including music generation codes, from a control device such as a nonvolatile memory 1316, for example an E2PROM, that is connected to the audio processor circuit 800 via the serial control port 812. Audio signals generated by the audio processor circuit 800 are transmitted via first stereo DAC 806, and second stereo DAC 808 to speakers 1318 to produce sound signals.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims. For example, the illustrative reflection and reverberation sound enhancement system is described as a filtering process executed by a digital signal processor controlled by software. In other embodiments, the early reflection and reverberation sound enhancement system may be implemented as a plurality of discrete filters such as analog filters or digital filters. In other embodiments, the reflection and reverberation sound enhancement system may be implemented using a general-purpose computer, a microprocessor, or other computational device.

Furthermore, in the illustrative embodiment the reflection and reverberation sound enhancement system utilizes finite impulse response (FIR) filters for the implementation of reflection filters. In other embodiments, other types of filters such as infinite impulse response (IIR) filters, or combined FIR and IIR filters may be used.

What is claimed is:

1. An audio signal processor for processing a sound signal supplied to a sound signal path, the audio signal processor comprising:

a first decimator coupled to a sound signal path to decimate the sound signal;

an early reflection processor coupled to the first decimator to generate an early reflection signal from the decimated sound signal;

a second decimator coupled to the early reflection processor to decimate the early reflection signal;

a reverberator coupled to the second decimator to generate a reverberation signal from the decimated early reflection signal;

a second interpolator coupled to the reverberator to restore a sampling rate reduced by the second decimator;

a first interpolator coupled t o the early reflection processor to restore a sampling rate reduced by the second decimator; and a summer coupled to the sound signal path, the first interpolator, and the second interpolator, the summer summing the sound signal, the early reflection signal, and the reverberation signal.

2. An audio signal processor according to claim 1, wherein:

the reverberator recirculates the early reflection sound signal in a plurality of iterations with a delay and a gain imposed between the iterations to form a reverberated sound signal.

3. An audio signal processor according to claim 1, further comprising:

a plurality of an early reflection processors coupled to the sound signal path to receive the sound signal;

a plurality of early reflection processor decimators respectively coupled to and associated with the early reflection processors for decimating the sound signal and simulating an early reflection signal; and a plurality of early reflection processor interpolators respectively coupled to and associated with the early reflection processors for interpolating the decimated early reflection sound signal.

4. An audio signal processor according to claim 1, wherein the reflection processor of the early reflection processor includes a finite impulse response (FIR) filter.

5. An audio signal processor according to claim 1, wherein the reverberator further comprises:

a plurality of comb filters and an all-pass filter coupled to the sound signal path for recirculating the early reflection sound signal in a plurality of iterations.

6. An audio signal processor according to claim 1 further comprising:

a processor; and a memory coupled to the processor, the memory storing computer code for implementing the early reflection processor, the reverberator, and the summer.

7. An audio signal processor according to claim 1 further comprising:

a plurality of electronic circuits implementing the early reflection processor, the reverberator, and the summer.

8. An integrated circuit comprising:

a plurality of semiconductor devices implementing an audio signal processor according to claim 1.

9. An audio signal processor according to claim 1 further comprising:

a plurality of output signal paths coupled to the reverberator and generating output signals to a respective plurality of output channels, individual output signal paths of the plurality of output signal paths including a filter and an interpolator.

10. An audio signal processor according to claim 1 further comprising:

a plurality of output signal paths coupled to the reverberator and generating output signals to a respective plurality of output channels, individual output signal paths of the plurality of output signal paths including an all-pass filter and an interpolator.

11. An audio signal processor according to claim 1 further comprising:

a left channel output signal path coupled to the reverberator and including a left channel all pass filter coupled to a left channel interpolator; and a right channel output signal path coupled to the reverberator and including a right channel all pass filter coupled to a right channel interpolator.

* * * * *